(12) United States Patent
Hirooka et al.

(10) Patent No.: US 6,993,919 B2
(45) Date of Patent: Feb. 7, 2006

(54) PROCESSING APPARATUS AND PROCESSING APPARATUS MAINTENANCE METHOD

(75) Inventors: Takaaki Hirooka, Yamanashi (JP); Masao Furuya, Yamanashi (JP); Shohei Tsutsumi, Osaka (JP)

(73) Assignees: Tokyo Electron Limited, Tokyo (JP); Daikin Industries, Ltd., Osaka (JP)

( * ) Notice: Subject to any disclaimer, the term of this patent is extended or adjusted under 35 U.S.C. 154(b) by 0 days.

(21) Appl. No.: 11/075,884

(22) Filed: Mar. 10, 2005

(65) Prior Publication Data

US 2005/0155373 A1 Jul. 21, 2005

Related U.S. Application Data

(63) Continuation of application No. PCT/JP03/11212, filed on Sep. 2, 2003.

(30) Foreign Application Priority Data

Sep. 10, 2002 (JP) .............................. 2002-263761

(51) Int. Cl.
*F25B 1/00* (2006.01)
(52) U.S. Cl. ........................... 62/115; 62/185; 62/259.2
(58) Field of Classification Search .................. 62/115, 62/185, 259.2, 498; 156/345.1; 118/723 R
See application file for complete search history.

(56) References Cited

U.S. PATENT DOCUMENTS 3,760,600 A * 9/1973 Matsui et al. .................. 62/137
4,585,920 A * 4/1986 Hoog et al. ............. 219/121.52
4,703,628 A * 11/1987 Togashi et al. ................ 62/135
5,380,421 A * 1/1995 Gorokhovsky ......... 204/298.41
5,919,332 A * 7/1999 Koshiishi et al. ...... 156/345.27
5,980,687 A * 11/1999 Koshimizu ............. 156/345.29
6,045,667 A * 4/2000 Moll ..................... 204/192.38
6,072,147 A * 6/2000 Koshiishi et al. ...... 219/121.43
6,171,438 B1 * 1/2001 Masuda et al. ......... 156/345.27
6,245,190 B1 * 6/2001 Masuda et al. ......... 156/345.46
6,332,331 B1 * 12/2001 Cheng et al. .................. 62/275
6,700,089 B1 * 3/2004 Hirooka .................... 219/121.4
2004/0068997 A1 * 4/2004 Hirooka et al. ............... 62/175

FOREIGN PATENT DOCUMENTS

JP 08-203866 8/1996
JP 2002-198356 A * 7/2002

* cited by examiner

*Primary Examiner*—Mohammad M. Ali
(74) *Attorney, Agent, or Firm*—Finnegan, Henderson, Farabow, Garrett & Dunner, L.L.P.

(57) ABSTRACT

The electrode temperature control device in a processing apparatus 100 includes a freezing circuit 110 comprising a compressor 148, a condenser 142, an expansion valve 150 and an evaporator 108 with the evaporator disposed inside a lower electrode 106. This electrode temperature control device does not require components such as a coolant tank for storing the coolant, a pump for supplying the coolant to the processing apparatus, a heater for adjusting the temperature of the coolant and a heat exchanger for exchanging heat between a primary coolant and a secondary coolant. Thus, the production cost can be lowered, a reduction in installation area through miniaturization of the apparatus is achieved and more efficient use of energy is achieved as well. In addition, by using $CO_2$ as the coolant, the GWP value can be reduced to approximately $1/8000$ to $1/7000$ that of Freon.

3 Claims, 3 Drawing Sheets

PROCESSING APPARATUS AND PROCESSING APPARATUS MAINTENANCE METHOD

CROSS REFERENCE TO RELATED APPLICATIONS

This is a continuation application of PCT International Application No.PCT/JP03/11212 filed Sep. 2, 2003, which claimed priority of Japanese Patent Application No.2002-263761, filed Sep. 10, 2002.

BACKGROUND OF THE INVENTION

1. Field of the Invention

The present invention relates to a processing apparatus and a processing apparatus maintenance method.

2. Description of Related Art

Various types of processing apparatuses including a plasma etching apparatus are used in the manufacturing of semiconductor devices or LCD substrates in the related art. The plasma etching apparatus, for instance, etches a workpiece such as a semiconductor wafer or a glass substrate placed on an electrode (a lower electrode) with plasma generated from a specific type of process gas inside a vacuum-processing chamber. During the etching process, the temperature of the workpiece is maintained at a specific level so as to ensure that the temperature of the workpiece is not raised by the plasma, to improve the etching aspect ratio and to regulate the shape of the etched workpiece.

The temperature of the workpiece is normally controlled by a cooling mechanism disposed at the electrode. Such a cooling mechanism adopts a structure in which a primary coolant (e.g., brine) is supplied into a coolant circulating path running inside the stage and the workpiece is cooled as the primary coolant absorbs heat. The temperature of the primary coolant is controlled at a freezing circuit through which a secondary coolant (e.g., Freon) circulates. The primary coolant in a coolant tank, the temperature of which has been controlled at the freezing circuit, is supplied into the coolant circulating path with a pump, and the temperature of the primary coolant returning from the coolant circulating path is adjusted again at the freezing circuit before the primary coolant is stored into the coolant tank. The drive of the freezing circuit is controlled so as to maintain the temperature of the primary coolant at a predetermined level by monitoring the temperature of the primary coolant inside the coolant tank or the temperature of the primary coolant supplied from the coolant tank into the coolant-circulating path.

Examples of multiple freezing cycles achieved by combining a primary coolant circulating circuit and a secondary coolant circulating circuit include that disclosed in Japanese Laid Open Patent Publication No. H08-203866.

The cooling mechanism in the processing apparatus adopting the structure described above requires two circuits, i.e., a primary coolant circulating circuit constituted with a coolant tank, a pump and the like and a freezing circuit (a secondary coolant circulating circuit) constituted with a compressor, a condenser, an expansion valve and an evaporator, and thus a problem arises in that the apparatus requires a significant installation area. In addition, there is another problem in that since heat is exchanged multiple times between the workpiece and the primary coolant, between the primary coolant and the secondary coolant, and between the secondary coolant and the atmosphere in the structure having the two circuits, the extent of energy loss is bound to be significant.

Furthermore, in the cooling mechanism in the processing apparatus adopting the structure described above, brine and Freon, for instance, are used respectively as the primary coolant and the secondary coolant. These PFC (perfluorocarbon) gases have high GWP (global warming potential) values and significantly hasten the process of global warming. From the viewpoint of global environment protection, it is crucial to minimize the use of PFC gases.

SUMMARY OF THE INVENTION

An object of the present invention, which has been completed by addressing the problems of the cooling mechanism in the processing apparatus in the related art discussed above, is to provide a new and improved temperature control device for an electrode in a processing apparatus, that achieves a reduction in the required installation area through miniaturization of the electrode temperature control device and also achieves energy saving.

Another object of the present invention is to provide a new and improved processing apparatus that does not use any PFC for the coolant in the freezing circuit and is thus more environmentally friendly.

Yet another object of the present invention is to provide a maintenance method ideal in application in conjunction with the processing apparatus achieving the advantages described above.

In order to achieve the objects described above, the present invention provides a processing apparatus having an electrode disposed inside a processing chamber, on which a workpiece can be placed, and a freezing circuit which comprises a compressor, a condenser, an expansion valve and an evaporator and cools the electrode by using $CO_2$ as a coolant. The processing apparatus is characterized in that the evaporator is a coolant flow path constituted with a spiral heat transferring wall disposed inside the electrode, that a three-way valve which allows any two paths among an expansion valve-side path, a coolant collection path and an evaporator-side path, to selectively communicate with each other is disposed in a path extending from the expansion valve to the evaporator at the freezing circuit and that a switching valve is disposed in a path extending from the evaporator to the compressor at the freezing circuit.

The structure described above achieves a reduction in the number of required components to constitute the freezing circuit. More specifically, the freezing circuit does not need components such as a coolant tank for storing the coolant, a pump for supplying the coolant to the processing apparatus, a heater for adjusting the temperature of the coolant and a heat exchanger for achieving heat exchange between the primary coolant and the secondary coolant. As a result, the production costs are lowered, a reduction in the installation area is achieved through the miniaturization of the apparatus and energy is utilized more efficiently.

In addition, since a three-way valve that allows any two paths among the expansion valve-side path, the coolant collection path and the evaporator-side path to selectively communicate with each other is disposed in the path extending from the expansion valve to the evaporator at the freezing circuit and a switching valve is disposed in the path extending from the evaporator to the compressor at the freezing circuit, the coolant can be collected into the coolant collection path which has been set in communication and thus, the electrode maintenance is facilitated.

Furthermore, by using $CO_2$ as the coolant in the freezing circuit, the GWP value can be reduced to approximately 1/8000 to 1/7000 that of Freon. Moreover, the evaporator is constituted as a coolant flow path formed with a spiral heat-transferring wall disposed inside the electrode. With the coolant flow path spiraling inside the electrode, uniformity is achieved with regard to the temperature of the workpiece to facilitate the temperature control of the workpiece.

By forming the coolant flow path so that the flow path becomes narrower toward the downstream side, turbulence in the coolant can be induced in the coolant flow path, and in such a case, heat can be absorbed into the workpiece efficiently.

It is desirable to disengage the electrode for the processing apparatus maintenance through the following procedure. Namely, maintenance work on the processing apparatus can be performed by first opening the three-way valve so as to communicate between the expansion valve-side path and the coolant collection path, driving the compressor to collect the coolant into the coolant collection path, closing the switching valve and the three-way valve after the coolant is collected, stopping the compressor and then disengaging the electrode.

Also, it is desirable to resume the operation of the freezing circuit through the following procedure. Namely, the operation of the freezing circuit should be resumed by opening the three-way valve so as to communicate between the coolant collection path and the evaporator-side path after reconnecting the electrode having been disengaged, evacuating the path extending from the three-way valve to the switching valve via the coolant collection path, then opening the three-way valve so as to communicate between the expansion valve-side path and the evaporator-side path, opening the switching valve and driving the compressor.

DETAILED DESCRIPTION OF THE PREFERRED EMBODIMENT

Figure 1:
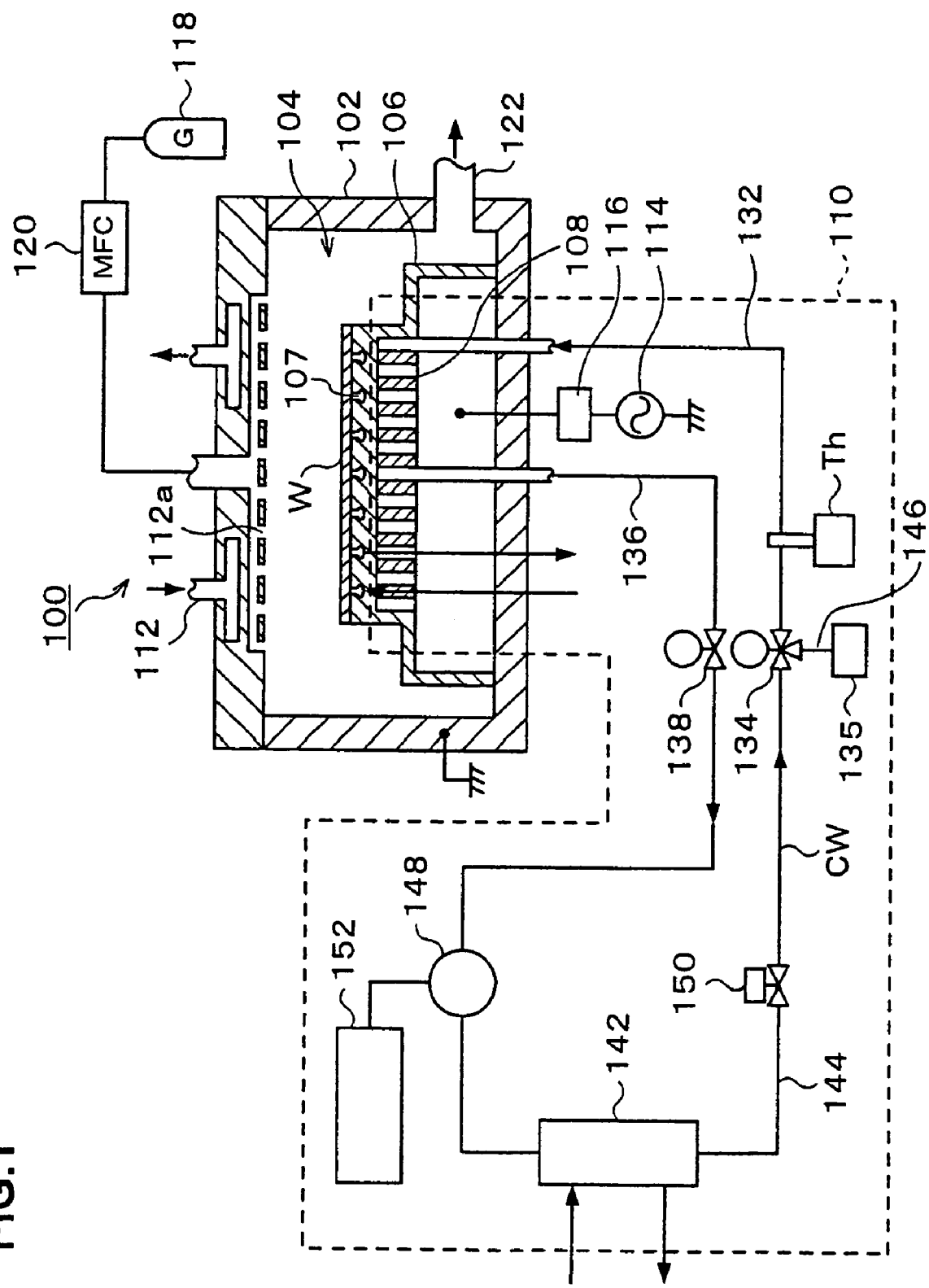
FIG. 1 is a schematic sectional view of the etching apparatus and the freezing circuit.

The following is a detailed explanation of a preferred embodiment of the processing apparatus and the processing apparatus maintenance method according to the present invention, given in reference to the attached drawings. It is to be noted that in the specification and drawings, the same reference numerals are assigned to components having substantially identical functions and structural features to preclude the necessity for a repeated explanation thereof.

A first feature characterizing the embodiment is that a coolant-circulating path disposed inside a lower electrode is constituted with a heat-transferring wall to allow the coolant-circulating path to function as an evaporator constituting part of the freezing circuit. A second feature characterizing the embodiment is that $CO_2$ is used as the coolant.

(1) Electrode Temperature Control Device in Processing Apparatus

First, a plasma etching apparatus 100 representing an example of the processing apparatus is explained in reference to FIG. 1.

A lower electrode 106 on which a semiconductor wafer (hereafter simply referred to as a wafer W) can be placed is disposed inside a processing chamber 104 formed in an airtight processing container 102. The lower electrode 106 includes a built-in coolant-circulating path 108 with which the wafer W is cooled via the lower electrode 106 so as to maintain the temperature of the wafer W at a predetermined level. A cooling gas passage 107 is formed at the upper surface of the lower electrode 106 (the surface on which the wafer W is placed). A cooling gas CG used to improve the efficiency with which heat is transferred between the wafer W and the coolant-circulating path 108 is supplied into the cooling gas passage 107. A freezing circuit 110 to be detailed later supplies a temperature-controlled coolant constituted of $CO_2$ into the coolant circulating path 108, collects the coolant CW having circulated through the coolant circulating path 108 and readjusts the temperature on the coolant thus collected.

In addition, an upper electrode 112 is disposed inside the processing chamber 104 so as to face opposite the surface of the lower electrode 106 on which the workpiece is placed. As high-frequency power output from a high-frequency source 114 is applied to the lower electrode 106 via a matcher 116 in the processing apparatus adopting the structure described above, plasma is generated with a process gas supplied into the processing chamber 104 from a process gas supply source G118 via a flow rate regulating valve MFC120 and numerous gas outlet holds 112a formed at the upper electrode 112. The wafer W is placed on the lower electrode 106 with its temperature maintained at the predetermined level and is etched with this plasma. The gas inside the processing chamber 104 is evacuated via an evacuation system 122.

In order to ensure that the temperature of the wafer W is controlled in an optimal manner in the plasma etching apparatus 100 described above, rigorous control needs to be implemented on the temperature of the coolant CW and the temperature of the wafer W needs to be made to conform rigorously to the temperature of the coolant CW. The efficiency with which the wafer W is cooled (or of the efficiency with which the lower electrode 106 is cooled) is greatly affected by the flow rate and the pressure of the coolant CW and the specific flow path through which the coolant CW flows. For this reason, it is necessary to design the coolant-circulating path 108 in an optimal shape and the like in order to improve the efficiency with which the wafer W is cooled.

Figure 2:
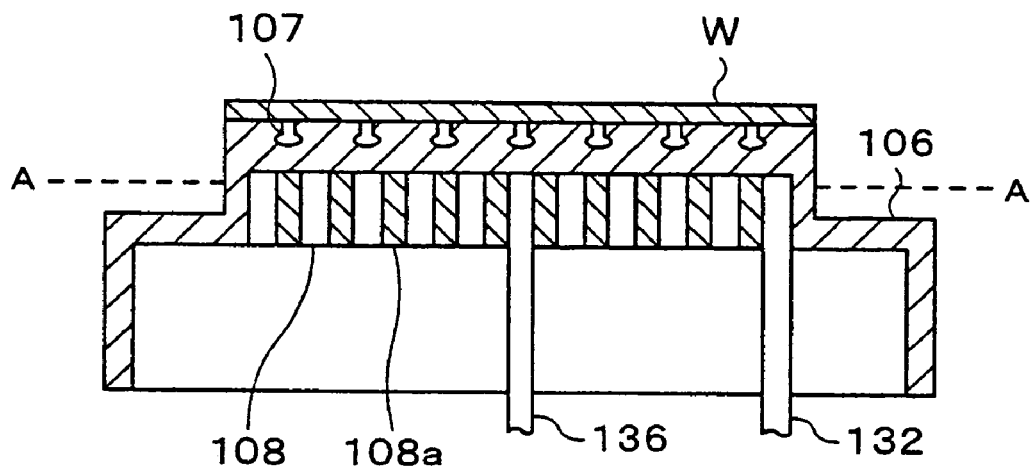
FIG. 2 is a schematic sectional view of the lower electrode.
Figure 3:
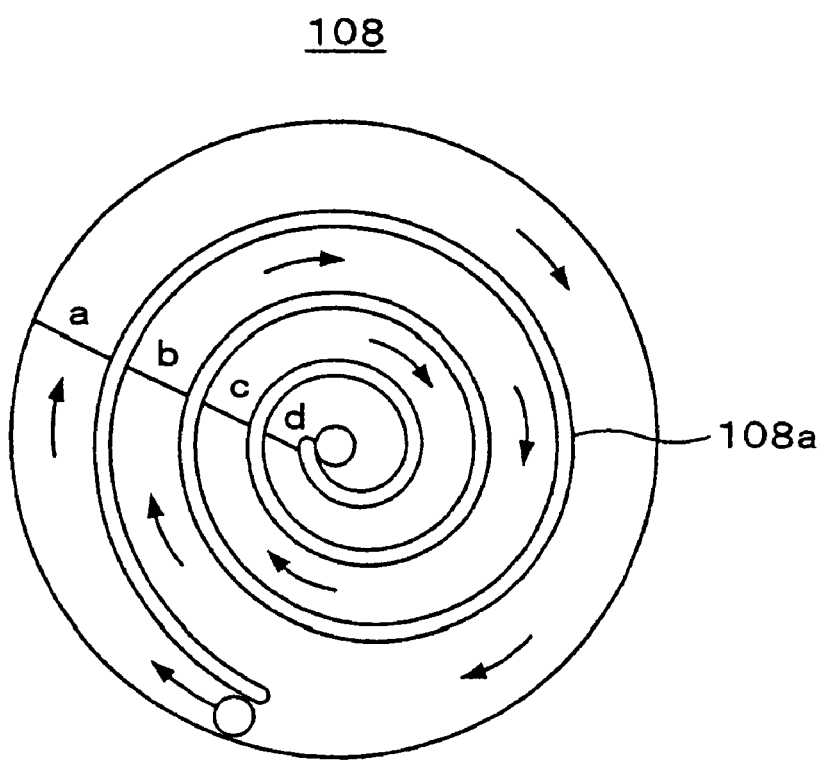
FIG. 3 is a sectional view taken along A—A in FIG. 2.

The coolant-circulating path 108 is now explained in reference to FIGS. 2 and 3.

FIG. 2 is a schematic sectional view of the lower electrode 106. As shown in FIG. 2, the coolant-circulating path 108 is constituted with fins (heat transferring wall bodies) 108a formed by using a heat conducting material such as aluminum. Such a coolant-circulating path 108 has a function of cooling the wafer W set on the lower electrode 106 and also functions as an evaporator that is a component of the freezing circuit 110.

FIG. 3 is a sectional view taken along A—A in FIG. 2, schematically showing the shape of the coolant-circulating path 108. The coolant-circulating path 108 is formed as a spiral path inside the lower electrode 106, as shown in FIG. 3. The arrows in FIG. 3 indicate the flow of the coolant CW. The evaporator achieved in the embodiment is characterized in that the width of the flow path is not constant, as shown in FIG. 3. In the example presented in FIG. 3, the coolant circulating path assumes a shape with the width of the flow path becoming narrower (a>b>c>d) further toward the downstream side, i.e., as the coolant CW travels from a coolant intake path 132 toward a coolant discharge path 136.

Generally speaking, an elastic substance (a compressible fluid, the specific volume of which changes in correspondence to the pressure level) flows through two different types of fluid movement, i.e., a laminar flow, in which the individual fluid molecules flow along the flow path parallel to one another and a turbulent flow in which the individual fluid molecules flow in an irregular motion along the direction perpendicular to the axis of the flow path. It is known that the turbulent flow of the coolant CW is more desirable from the viewpoint of allowing the coolant CW to absorb the heat of the wafer W more efficiently.

Accordingly, a turbulent flow of the coolant CW is induced in the embodiment by varying the width of the flow path at the evaporator, as shown in FIG. 3, and thereby applying a suitable pressure to the coolant CW. It is to be noted that FIG. 3 simply presents an example of a shape that may be assumed in the coolant circulating path, and that the optimal shape (the width of the flow path, etc.) for creating a turbulent flow of the coolant CW can be determined through simulation or the like in the actual application. As a turbulent flow of the coolant CW is created in the coolant circulating path 108 structured as described above, the efficiency of heat absorption is improved and thus, the temperature control of the wafer W is facilitated.

Next, the freezing cycle 110 is explained.

The freezing cycle 110 it is constituted with the coolant circulating path (evaporator) 108 described above through which the coolant CW exchanges heat with the wafer W, a heat exchanger (condenser) 142 at which the coolant CW exchanges heat with cooling water and a heat exchange path 144 through which the coolant CW traveling through the coolant circulating path 108 and the heat exchanger 142 to achieve heat transfer between the coolant circulating path 108 and the heat exchanger 144, is circulated. In addition, a pump (compressor) 148 and a switching valve (expansion valve) 150 are disposed at the heat exchange path 144. An inverter 152 used to control the drive of the freezing circuit 110 is connected to the pump 148.

A three-way valve 134 and a temperature detector Th that detects the temperature of the coolant CW are disposed in the path extending from the switching valve 150 to the coolant circulating path 108. With the three-way valve 134, any two paths among a path (coolant supply path 132) extending to the coolant circulating path 108, a path (the heat exchange path 144) extending to the heat exchanger 142 and a path (coolant collection path 146) extending to a vacuum pump 135 are allowed to selectively communicate with each other. In addition, the temperature detection value obtained at the temperature detector Th is provided to a control system (not shown). The control system implements drive control on the freezing circuit 110 that adjusts the temperature of the coolant CW in correspondence to the temperature detection value provided by the temperature detector Th. Since the quantity of heat in the coolant or the flow rate of the coolant can be controlled through feedback so as to control the heat quantity or the flow rate in conformance to a target adjusted temperature, the temperature of the wafer W can be more accurately controlled.

In addition, in the path (hereafter referred to as the coolant discharge path) 136 extending from the coolant-circulating path 108 to the pump 148, a switching valve 138 that allows the coolant CW to be discharged through the coolant discharge path 136 is disposed. It is to be noted that a temperature detector may also be disposed in the coolant discharge path 136 so as to execute drive control for the freezing circuit 110 based upon the temperature detection value provided by this temperature detector.

The temperature of the wafer W is adjusted by using the coolant CW in the coolant-circulating path 108 in the freezing circuit 110 adopting the structure described above. Namely, as the coolant CW having been cooled in the heat exchanger 142 is circulated at a predetermined flow rate through the coolant circulating path 108 via the coolant supply path 132, the coolant CW evaporates, the heat of the wafer W is absorbed into the coolant CW as the resulting heat of vaporization and thus, the temperature of the wafer W is adjusted at a specific level. By adjusting the pump discharge rate at the pump 148, the temperature of the wafer W can be varied as desired. Namely, by increasing the flow rate of the coolant CW, the temperature of the wafer W is lowered, whereas the temperature of the wafer W is raised by reducing the flow rate of the coolant CW.

As described above, the structure achieved in the embodiment does not require components such as a coolant tank for storing the coolant, a pump for supplying the coolant to the processing apparatus, a heater for adjusting the temperature of the coolant and a heat exchanger for exchanging heat between the primary coolant and the secondary coolant. Thus, the production costs can be lowered, a reduction in the required installation area is achieved through miniaturization of the apparatus and better energy efficiency is achieved.

Furthermore, by using $CO_2$ as the coolant CW in the freezing circuit 110, the global warming potential (GWP) value can be reduced to approximately $1/8000$ to $1/7000$ that of a PFC gas. In addition, while regular maintenance (or replacement) of the lower electrode 106 is necessary, the extent of adverse leakage during maintenance work can be reduced. It is to be noted that the maintenance work on the lower electrode 106 is to be described in specific detail later.

Since the evaporator 108 is formed as a coolant flow path constituted with a heat transferring wall disposed inside the lower electrode 106 and the coolant flow path spirals inside the lower electrode, consistency is achieved with regard to the temperature of the wafer W to facilitate temperature control for the wafer W. Furthermore, since the evaporator assumes a shape that creates a turbulent flow of the coolant CW, the heat of the wafer W can be absorbed with a high degree of efficiency to facilitate temperature controlled for the wafer W.

Moreover, since the three-way valve 134 communicating with the vacuum pump 135 is disposed in the coolant supply path 132 extending from the expansion valve 150 to the evaporator 108 at the freezing circuit and the switching valve 138 is disposed in the coolant discharge path 136 extending from the evaporator 108 to the compressor 148 at the freezing circuit, the maintenance work on the lower electrode 106 is facilitated by collecting the coolant CW through the vacuum pump 135 set in communication.

Figure 4:
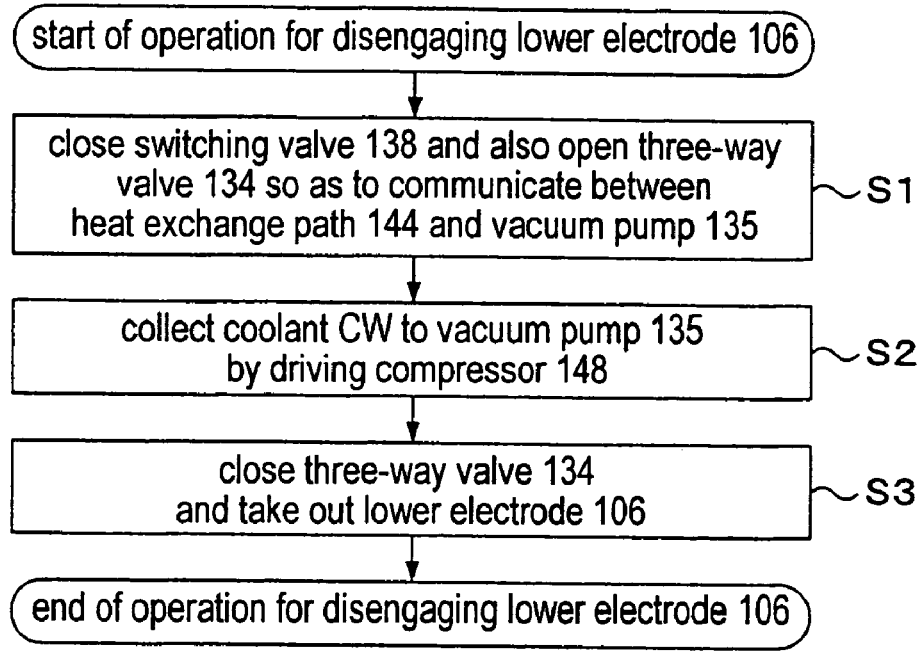
FIG. 4 presents a flowchart of the lower electrode disengaging process.

Next, the maintenance method and the drive method to be adopted in conjunction with the plasma etching apparatus 100 described above are explained in reference to FIGS. 4 and 5.

(2) Method for Executing Maintenance Work on Processing Apparatus

Part of the maintenance work that the plasma etching apparatus 100 needs to undergo is maintenance on or replacement of the lower electrode 106. The flow of such maintenance work is now explained in reference to FIG. 4.

When disengaging the lower electrode 106, the switching valve 138 is closed and the three-way valve 134 is opened so as to allow the coolant supply path 132 and the heat exchange path 144 (the expansion valve-side path) to communicate with each other (step S1). Next, the coolant CW is collected in the vacuum pump 135 by driving the compressor 148 (step S2). After collecting the coolant CW, the three-way valve 134 is closed and then the lower electrode 106 is disengaged (step S3).

Since $CO_2$ is used as the coolant CW, $CO_2$ may be released into the atmosphere without collecting the coolant CW in step S2 in the embodiment. However, as $CO_2$ remains in great quantity (approximately 10 $dm^3$) in the coolant supply path 132, the coolant circulating path 108 and the coolant discharge path, it is more desirable to collect $CO_2$ for reuse.

(3) Method of Processing Apparatus Operation

Figure 5:
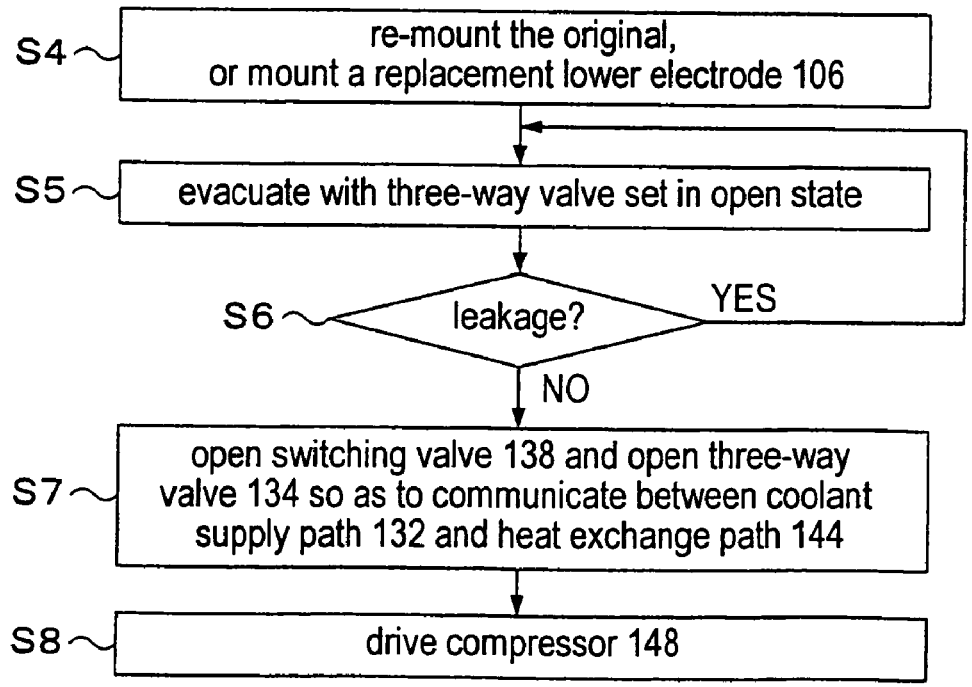
FIG. 5 presents a flowchart of the freezing circuit drive.

The specific method adopted to operate the plasma etching apparatus 100 after conducting maintenance work on the lower electrode 106 or for the initial operation is now explained in reference to FIG. 5.

First, the lower electrode 106 having undergone maintenance work (or replacement) is mounted (step S4). With the three-way valve 134 opened, the coolant supply path 132, the coolant circulating path 108 and the coolant discharge path 136 are evacuated (step S5). After confirming that there is no leak (step S6), the switching valve 138 is opened and also the three-way valve 134 is opened so as to communicate between the coolant supply path 132 and the heat exchange path 144 (the expansion valve-side path) (step S7). Then, the compressor 148 is driven (step S8).

While the invention has been particularly shown and described with respect to a preferred embodiment of the processing apparatus and the processing apparatus maintenance method according to the present invention by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiment on an example in which the temperature sensor Th is disposed in the coolant supply path 132 and temperature control is implemented in reference to the temperature of the coolant CW circulating through the path extending from the expansion valve 150 to the evaporator 108 at the freezing circuit 110, the present invention is not limited to this structural example. For instance, the temperature sensor Th may be disposed in the coolant discharge path 136 and the temperature control may be implemented in reference to the temperature of the coolant CW circulating through the path extending from the evaporator 108 to the compressor 148 at the freezing circuit 110 instead.

In addition, while an explanation is given above in reference to the embodiment on an example in which the temperature of the coolant is controlled in reference to the temperature of the workpiece (wafer W), the present invention is not limited to this example. For instance, the temperature of the coolant may be controlled in reference to the temperature of the electrode (lower electrode 106).

As explained above, by adopting the present invention, a reduction in the installation area can be achieved through miniaturization of the electrode temperature control device in the processing apparatus and more efficient use of energy is achieved. In addition, since $CO_2$ is used as the coolant in the freezing circuit, a more environmentally friendly processing apparatus is achieved.

The present invention may be adopted in a processing apparatus such as a plasma etching apparatus used in a manufacturing process in semiconductor device or LCD substrate production and in a processing apparatus maintenance method.

What is claimed is:

1. A processing apparatus, having:
    an electrode disposed inside a processing chamber, on which a workpiece can be placed; and
    a freezing circuit comprising a compressor, a condenser, an expansion valve and an evaporator, which cools said electrode by using $CO_2$ as a coolant, wherein:
    said evaporator is a coolant flow path constituted with a spiral heat-transferring wall disposed inside said electrode;
    a three-way valve which allows any two paths among an expansion valve-side path, a coolant collection path and an evaporator-side path, to selectively communicate with each other is disposed in a path extending from said expansion valve to said evaporator at said freezing circuit;
    a switching valve is disposed in a path extending from said evaporator to the compressor at said freezing circuit; and
    said coolant flow path becomes narrower toward the downstream side.

2. A processing apparatus maintenance method for performing maintenance work on a processing apparatus, having:
    an electrode disposed inside a processing chamber, on which a workpiece can be placed; and
    a freezing circuit that comprises a compressor, a condenser, an expansion valve and an evaporator and cools the electrode by using $CO_2$ as a coolant, with:
    said evaporator, formed as a coolant flow path constituted with a spiral heat-transferring wall disposed in said electrode;
    a three-way valve, which allows any two paths among an expansion valve-side path, a coolant collection path and an evaporator-side path to selectively communicate with each other, disposed in a path extending from said expansion valve to said evaporator at said freezing circuit; and
    a switching valve disposed in a path extending from said evaporator to the compressor at said freezing circuit, wherein:
    when disengaging said electrode, said three-way valve is opened so as to communicate between said expansion valve-side path and said coolant collection path, said coolant is collected into said coolant collection path by driving said compressor, said switching valve is closed and said three-way valve is closed after said coolant is collected, said compressor is stopped and then said electrode is disengaged.

3. A processing apparatus maintenance method according to claim 2, wherein:
    when resuming operation of said freezing circuit, said three-way valve is opened so as to communicate between said coolant collection path and said evaporator-side path after reconnecting said electrode having been disengaged, the path extending from said three-way valve to said switching valve is evacuated via said coolant collection path, then said three-way valve is opened so as to communicate between said expansion valve-side path and said evaporator-side path, said switching valve is opened and said compressor is driven.

* * * * *